(12) United States Patent
Seo

(10) Patent No.: US 8,618,605 B2
(45) Date of Patent: Dec. 31, 2013

(54) SEMICONDUCTOR DEVICE AND METHOD OF MANUFACTURING THE SAME

(75) Inventor: Yong Won Seo, Wonju (KR)

(73) Assignee: Hynix Semiconductor Inc., Icheon (KR)

(*) Notice: Subject to any disclaimer, the term of this patent is extended or adjusted under 35 U.S.C. 154(b) by 167 days.

(21) Appl. No.: 13/176,395

(22) Filed: Jul. 5, 2011

(65) Prior Publication Data

US 2012/0007186 A1 Jan. 12, 2012

(30) Foreign Application Priority Data

Jul. 6, 2010 (KR) .................. 10-2010-0064827

(51) Int. Cl.
*H01L 29/66* (2006.01)
(52) U.S. Cl.
USPC ..... 257/331; 257/332; 257/368; 257/E27.087
(58) Field of Classification Search
USPC .......... 257/368, 382, 314–324, 296, 300, 257/E27.087, E27.088, E21.656, E21.657, 257/E21.659, 331, 332
See application file for complete search history.

(56) References Cited

U.S. PATENT DOCUMENTS

| | | | | |
|---|---|---|---|---|
| 5,449,931 | A * | 9/1995 | Peek et al. ................. | 257/231 |
| 6,236,079 | B1 * | 5/2001 | Nitayama et al. .......... | 257/306 |
| 6,746,918 | B2 * | 6/2004 | Wu ............................. | 438/257 |
| 6,774,424 | B2 * | 8/2004 | Lee ............................. | 257/304 |
| 2006/0124979 | A1 * | 6/2006 | Yun et al. .................... | 257/296 |
| 2006/0163631 | A1 * | 7/2006 | Chen et al. ................. | 257/296 |
| 2007/0152255 | A1 * | 7/2007 | Seo et al. .................... | 257/302 |
| 2007/0189056 | A1 * | 8/2007 | Joo et al. .................... | 365/145 |
| 2008/0048333 | A1 * | 2/2008 | Seo et al. .................... | 257/773 |
| 2008/0224269 | A1 * | 9/2008 | Park et al. .................. | 257/617 |
| 2008/0315312 | A1 * | 12/2008 | Kim et al. ................... | 257/350 |
| 2009/0020808 | A1 * | 1/2009 | Yu ............................. | 257/330 |

FOREIGN PATENT DOCUMENTS

| | | | |
|---|---|---|---|
| KR | 1020010003628 | A | 1/2001 |
| KR | 1020020046036 | A | 6/2002 |
| KR | 1020080035799 | A | 4/2008 |

* cited by examiner

*Primary Examiner* — Cuong Q Nguyen
*Assistant Examiner* — Yosef Gebreyesus

(57) ABSTRACT

A semiconductor device includes a first gate electrode buried within a semiconductor substrate, a second gate electrode buried within a silicon growth layer disposed on the semiconductor substrate, and a bit line disposed on an interlayer insulating layer disposed on the semiconductor substrate between the first gate electrode and a second gate electrode. Therefore, the number of gates disposed in an active region is increased so that a total memory capacity of the semiconductor device, thereby reducing fabrication cost and improving productivity.

11 Claims, 15 Drawing Sheets

(i)

(ii)

(i)

(ii)

SEMICONDUCTOR DEVICE AND METHOD OF MANUFACTURING THE SAME

CROSS-REFERENCES TO RELATED APPLICATION

The present application claims priority to Korean patent application No. 10-2010-0064827 filed on 6 Jul. 2010, which is incorporated by reference in its entirety.

BACKGROUND OF THE INVENTION

1. Technical Field

The present invention relates to a semiconductor device and a method of manufacturing the same.

2. Related Art

Semiconductor devices are fabricated through a process of implanting impurities into a region in a silicon wafer or depositing a material on the silicon wafer, or the like. Semiconductor devices include many elements such as transistors, capacitors, or resistors to perform fixed purposes and these elements are connected to each other to receive or transmit data or signals.

As fabrication technology of semiconductor devices advances, efforts to form as many chips as possible on one wafer have continued by improving the integrity of semiconductor devices. Thereby, a minimum line width on a design rule becomes smaller to increase integrity. Further, in the semiconductor devices, high speed operation and low power consumption are required.

In order to improve the integrity of a semiconductor device, dimensions of components within the semiconductor device have to be scaled down and lengths and widths of interconnections have to be reduced. For example, typically a word line for transferring a control signal and a bit line for transferring data are the interconnections used within a semiconductor memory device. When widths or cross-sectional sizes of the word line and the bit line are reduced, resistance, which interrupts the transmission of the control signal or data, is increased. Such resistance delays the transmission speed of signals or data within the semiconductor device, increases power consumption, and further damages operation stability of the semiconductor memory device.

On the other hand, when the widths of the word line and bit line are maintained, as in the related art, to prevent an increase in resistance regardless of increases in the integrity, the physical distance between adjacent word lines or bit lines decreases. As compared with the word line to which a control signal having a relatively high potential is transmitted, the bit line that transfers data from the unit cell capacitor may not normally transfer the data due to parasitic capacitance. When the data is not smoothly transferred through the bit line, the sense amplifier, which senses and amplifies the data, may not sense the data and thus the semiconductor device cannot output data stored in the unit cell.

There is a method of increasing amounts of charges corresponding to data output from the unit cell in order to solve the problems due to the increase of parasitic capacitance in the bit line, but the size of a capacitor within a unit cell of a semiconductor memory device has to be increased to obtain this result. However, as the integrity of the semiconductor memory device increases, an area occupied by the capacitor within the semiconductor memory device shrinks.

Shrinkage of the area occupied by the capacitor occurs when the size of a unit cell of a semiconductor device is reduced. For example, a unit cell may be reduced from 8F2 to 6F2 or from 6F2 to 4F2. Here, "F" denotes a minimum pattern size obtainable under a given design rule. The smaller a unit cell size, the shorter the distance between the fine patterns.

6F2 denotes that the size of the unit cell is reduced by 2F2 as compared with a semiconductor device under an 8F2 configuration. Thus, in the semiconductor device with the size of the unit cell of 8F2, an active region has an elliptical shape in which a longitudinal axis is parallel to a longitudinal axis of a bit line, and a word line has a protruding structure on a semiconductor substrate. On the other hand, in the semiconductor device with the size of the unit cell of 6F2, an active region has an elliptical shape in which a longitudinal axis thereof is inclined to a predetermined angle with respect to a longitudinal axis of a bit line, and a word line has a buried gate structure buried within a semiconductor substrate.

In a semiconductor device with the size of the unit cell of 6F2, a bit line contact plug is in contact with the active region between the buried gates and the bit line is stacked on the bit line contact plug to be in contact with an upper portion of the bit line contact plug. In addition, a storage node contact plug is disposed at both sides of the bit line to be in contact with the active region. However, when the bit line is misaligned so that the bit line is not in contact with a central portion of the bit line contact plug, but is in contact with an edge of the bit line contact plug, the bit line contact plug is in contact with the storage contact plugs disposed at both sides of the bit line, thereby resulting in an electrical short. On the other hand, when the bit line is formed to have a large width or a bit line sidewall spacer is formed to have a thick width, a contact area between the active region and the storage node contact plug is reduced, thereby increasing resistance.

SUMMARY

The present invention is directed to providing a semiconductor device and a method of manufacturing the same, which prevents characteristics thereof from degrading due to failure caused by a complicated process of forming the semiconductor device with pattern miniaturization due to the high integrity.

According to one aspect of an exemplary embodiment, a semiconductor device includes a first gate electrode formed in a semiconductor substrate, a second gate electrode formed in a silicon growth layer provided over the semiconductor substrate, a bit line disposed between on the semiconductor substrate and the silicon growth layer, a first insulating layer formed over the first gate electrode and a second insulating layer formed over the second electrode.

The first gate electrode and second gate electrode may extend perpendicular to the bit line.

The semiconductor device may further include storage node contact plugs diagonally disposed while being spaced apart from the second gate electrode and the bit line.

The semiconductor device may further include a metal contact plug, coupled to a bottom of the storage node contact plugs and formed in the silicon growth layer and the semiconductor substrate.

The semiconductor device may further include a polysilicon layer, which is coupled to a bottom of the metal contact plug.

The polysilicon layer may be coupled to the semiconductor substrate.

A bottom of the polysilicon layer is formed at substantially the same level as a bottom of the first gate electrode.

The semiconductor device may further include an insulating layer formed at sidewalls of the polysilicon layer and the metal contact plug.

The semiconductor device may further include a first insulating layer disposed at a bottom and sidewall of the first gate electrode and a second insulating layer disposed at a bottom and sidewall of the second gate electrode.

According to another aspect of an exemplary embodiment, a semiconductor device includes a semiconductor substrate, an epitaxial layer, a bit line provided between the substrate and the epitaxial layer, the bit line being isolated from the substrate and coupled to the epitaxial layer, a storage node contact plug extending through the bit line and having a first portion and a second portion, the first portion extending into the epitaxial layer and the second portion extending into the substrate, a first gate electrode formed in the substrate and a second gate electrode formed in the epitaxial layer, a first insulating layer formed over the first gate electrode and a second insulating layer formed over the second electrode.

The semiconductor device may further include a third insulating layer disposed at a bottom and a sidewall of the first gate electrode, and a fourth insulating layer disposed at a bottom and sidewall of the second gate electrode According to another aspect of an exemplary embodiment, a method of manufacturing a semiconductor device includes forming a first gate electrode buried within a semiconductor substrate, forming an interlayer insulating layer and a bit line on the semiconductor substrate, growing a silicon growth layer on the semiconductor substrate and the bit line using the semiconductor substrate as a seed, and forming a second gate electrode buried in the silicon growth layer.

The forming the first gate electrode may include forming a trench by etching the semiconductor substrate; forming a first insulating layer over the semiconductor substrate including the trench; forming a first gate electrode layer over the first insulating layer to fill the trench; forming etch-back process the first gate electrode layer; forming a second insulating layer over the first gate electrode; and etching process for planarization of the second insulating layer to expose the semiconductor substrate.

The forming the bit line may include forming a bit line electrode layer on the semiconductor substrate including the first gate and the interlayer insulating layer and patterning the first gate electrode layer to expose the semiconductor substrate.

The growing the silicon growth layer may include forming the silicon growth layer through an epitaxial growth method using the semiconductor substrate as a seed.

The forming the second gate electrode may include forming a trench by etching the silicon growth layer; forming a third insulating layer over the silicon growth layer including the trench; forming a second gate electrode layer over the third insulating layer to fill the trench; forming etch-back process the second gate electrode layer; forming a fourth insulating layer over the first gate electrode; and etching process for planarization of the fourth insulating layer to expose the silicon growth layer.

The method may further include, after the forming the second gate electrode, forming metal contact holes by etching the silicon growth layer and the semiconductor substrate to be diagonally spaced apart with the second gate electrode and the bit line as the center, forming an insulating layer on each of the metal contact holes, removing a portion of the insulating layer that is formed at a bottom of each of the metal contact holes to expose the semiconductor substrate, forming the polysilicon layer to be buried within a lower portion of each of the metal contact holes and to be in contact with the semiconductor substrate, forming a metal contact plug on the polysilicon layer to be buried within each of the metal contact holes.

The forming the metal contact holes may include etching the silicon growth layer and the semiconductor substrate so that a bottom of the first gate electrode has the same surface level as the bottoms of the metal contact holes.

The method may further include, after forming the metal contact plugs, etching a portion of the silicon growth layer other than portions in which the second gate electrode and the metal contact plug are arranged to form a trench for isolation, forming an interlayer insulating layer on the silicon growth layer including the trench for isolation, etching the interlayer insulating layer to expose the metal contact plug thereby forming a storage node contact hole, and forming a storage node contact plug to be buried within the storage node contact hole.

These and other features, aspects, and embodiments are described below in the section entitled "DESCRIPTION OF EXEMPLARY EMBODIMENT."

BRIEF DESCRIPTION OF THE DRAWINGS

The above and other aspects, features, and other advantages of the subject matter of the present disclosure will be more clearly understood from the following detailed description taken in conjunction with the accompanying drawings, in which.

DESCRIPTION OF EXEMPLARY EMBODIMENT

Figure 1:
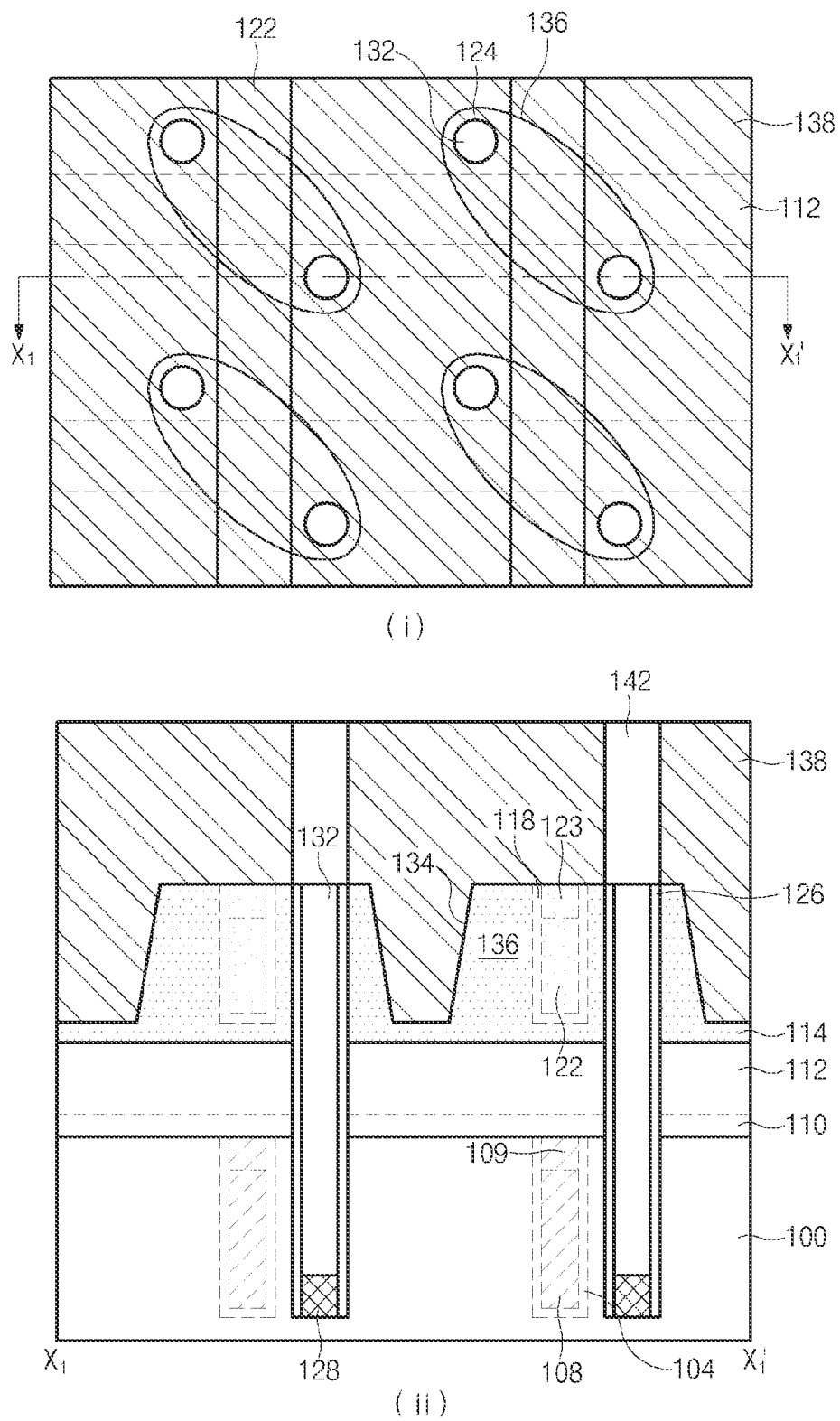
FIG. 1 is a view illustrating a semiconductor device according to an exemplary embodiment of the present invention, wherein (i) is a plan view and (ii) is a cross-sectional view taken along a line $X_1$-$X_1$.

Exemplary embodiments are described herein with reference to cross-sectional illustrations that are schematic illustrations of exemplary embodiments (and intermediate structures). Variations in shape due to, for example, manufacturing techniques and/or tolerances, are to be expected. Thus, exemplary embodiments should not be construed as limited to the particular shapes of regions illustrated herein, but may include deviations in shapes that result, for example, from manufacturing. In the drawings, lengths and sizes of layers and regions may be exaggerated for assisting understanding. Like reference numerals in the drawings denote like elements. It is also understood that when a layer is referred to as being "on" another layer or substrate, it can be directly on the other layer or substrate, or intervening layers may also be present.

Hereinafter, a semiconductor device and a method of manufacturing the same according to an exemplary embodiment of the present invention will be described in detail with reference to accompanying drawings.

Referring to FIG. 1, the semiconductor device may include a first gate electrode 108 formed in a semiconductor substrate 100, a second gate electrode 122 formed in a silicon growth layer 114 disposed over the semiconductor substrate 100, and a bit line 112 formed over the semiconductor substrate 100 between the first gate electrode 108 and the second gate electrode 122.

The first gate electrode 108 and the second gate electrode 122 may be arranged perpendicular to the bit line 112. The semiconductor device may further include an insulating layer 109 formed over the first gate electrode 108 and an insulating layer 123 formed over the second electrode 122. The semiconductor device may further include storage node contact plugs 142 spaced apart diagonally across the second gate electrode 122 and across the bit line 112. Metal contact plugs 132 are in contact with an end of the storage node contact plugs 142 and are formed in the silicon growth layer 114 and the semiconductor substrate 100. In addition, a polysilicon layer 128 may be disposed below the metal contact plug 132 and a bottom of the polysilicon layer 128 may be formed at substantially the same level as the bottom of the first gate electrode 108.

The semiconductor device may further include an insulating layer 126 disposed at sidewalls of the polysilicon layer 128 and the metal contact plug 132. The semiconductor device may further include an insulating layer 104 disposed at the bottom and a sidewall of the first gate electrode 108 and an insulating layer 118 disposed at the bottom and sidewall of the second gate electrode 122, an interlayer insulating layer 138 is formed to fill in the trench 134 for device isolation. The semiconductor device may further include an interlayer insulating layer 110 disposed below the bit line 112.

The silicon growth layer 114, in which the second gate electrode 122 and the metal contact plug 132 are included, may further include an active region 136 defined by a trench 134 for device isolation formed in an area of the silicon growth layer 114.

As described above, according to an exemplary embodiment, two gates are formed in a narrow active region to increase memory capacity so that a semiconductor device having high integration can be obtained.

Hereinafter, a method of manufacturing a semiconductor device having the above-described structure according to an exemplary embodiment of the present invention will be described.

Figure 2A:
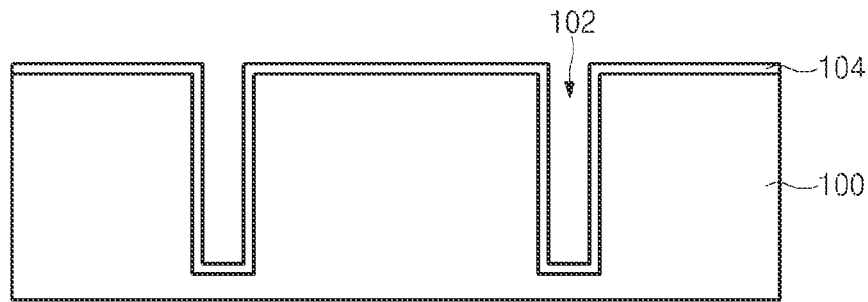
FIGS. 2A to 2R are views illustrating a method of manufacturing a semiconductor device according to an exemplary embodiment of the present invention.

Referring to FIG. 2A, a mask pattern (not shown) defining a trench is formed on a semiconductor substrate 100 and the semiconductor substrate 100 is etched to form a trench 102 using the mask pattern (not shown) as a mask. Subsequently, an insulating layer 104 is formed on the semiconductor substrate 100 including the trench 102. Here, the insulating layer 104 may be an oxide layer, which is formed by oxidizing the semiconductor substrate 100.

Figure 2B:
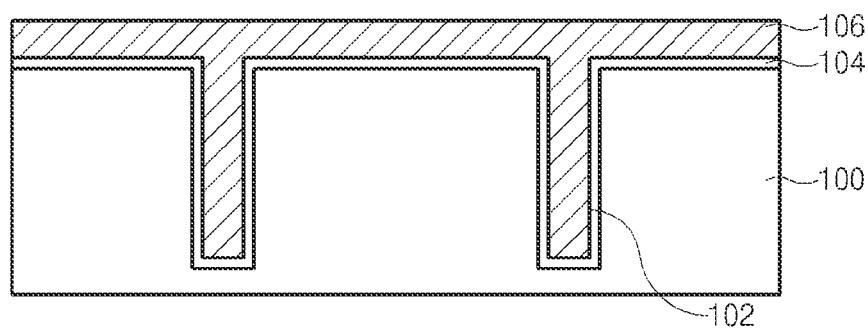

Referring to FIG. 2B, a first gate electrode layer 106 is formed on the insulating layer 104 to fill in the trench 102. Here, the first gate electrode layer 106 may be a tungsten layer.

Figure 2C:
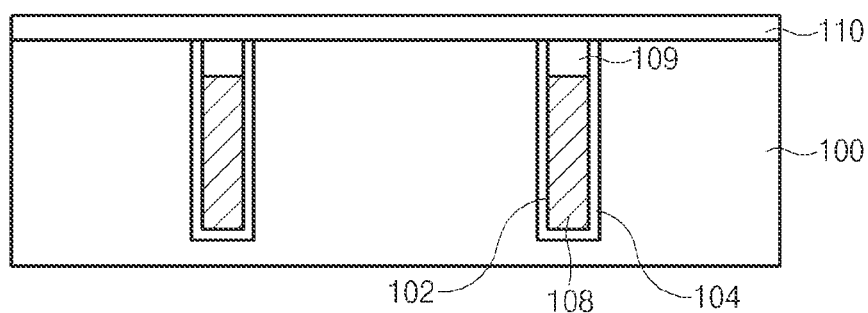

Referring to FIG. 2C, an etch-back process of the first gate electrode layer 106 is performed to form a first gate electrode 108 and an forming process of insulating layer 109 is performed over the first gate electrode 108 and etching process for planarization of the insulating layer 109 is performed to expose the semiconductor substrate 100, and then an interlayer insulating layer 110 is formed over the semiconductor substrate 100, including the insulating layer 109. Here, the interlayer insulating layer 110 may include an oxide layer.

Figure 2D:
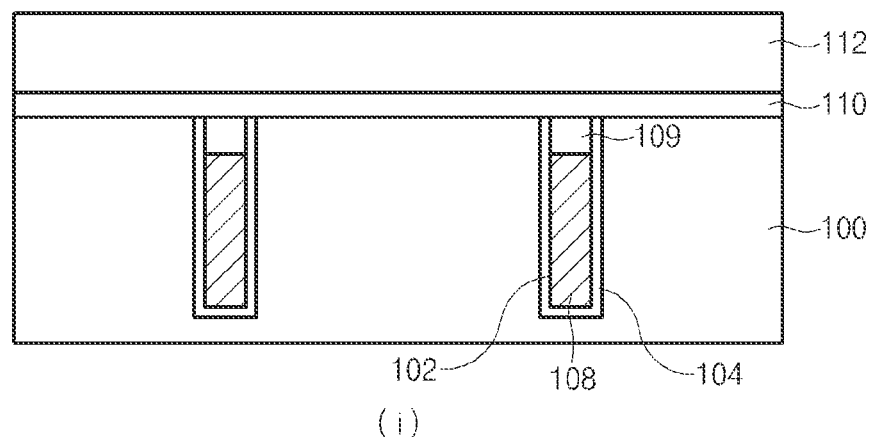
Figure 2D:
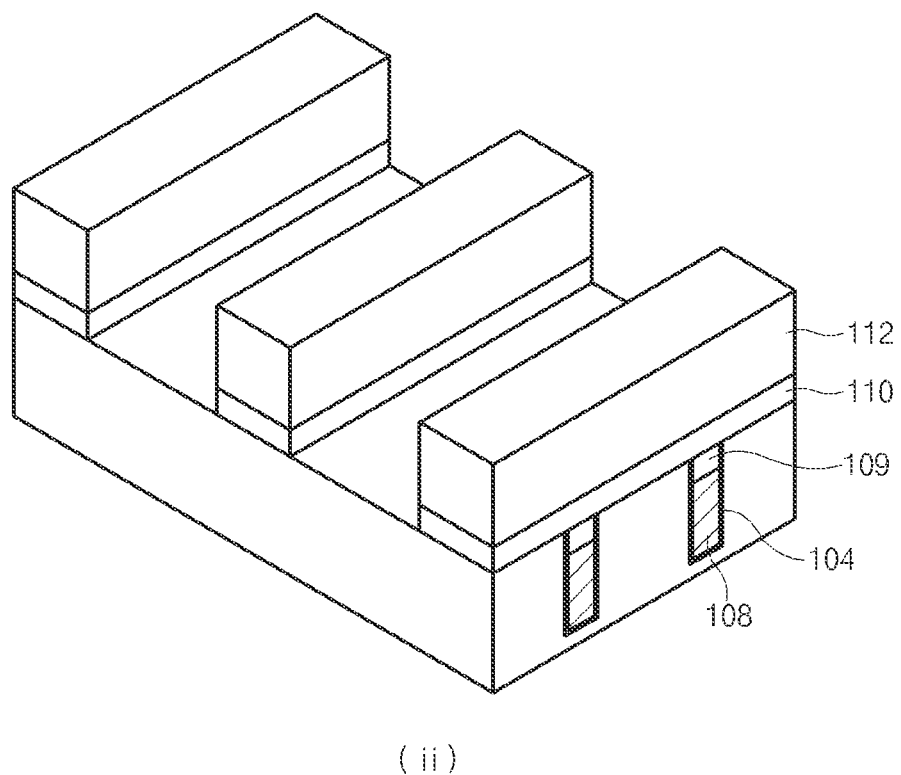

Referring to FIG. 2D, a bit line electrode layer is formed on the interlayer insulating layer 110 and patterned to expose the semiconductor substrate 100, thereby forming a bit line 112.

Figure 2E:
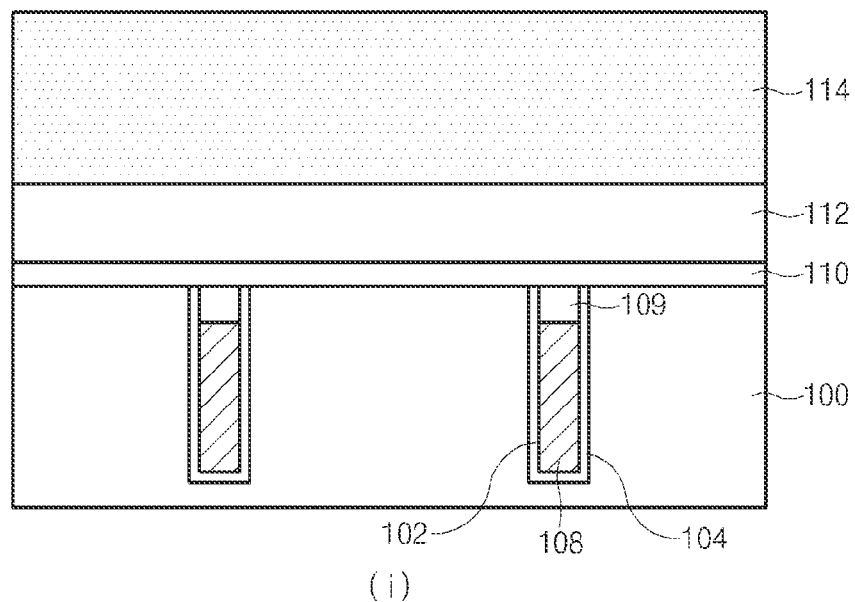
Figure 2E:
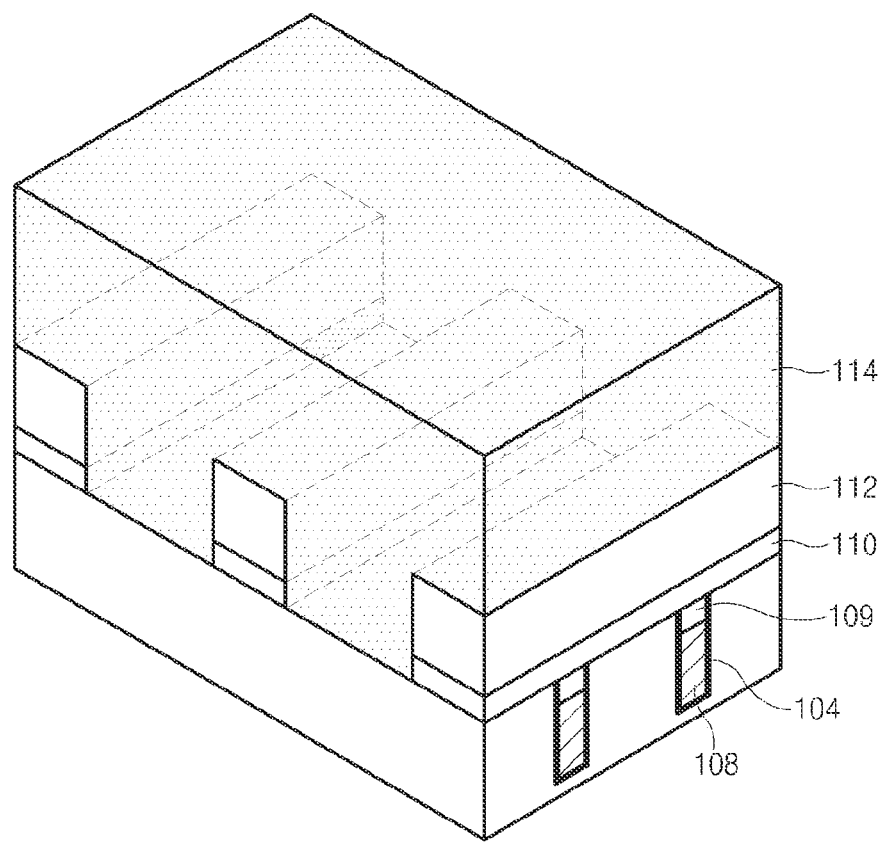

Referring to FIG. 2E, a silicon growth layer 114 is formed to cover the bit line 112 through an epitaxial growth method using the semiconductor substrate 100 exposed by the bit line 112 as a seed.

Figure 2F:
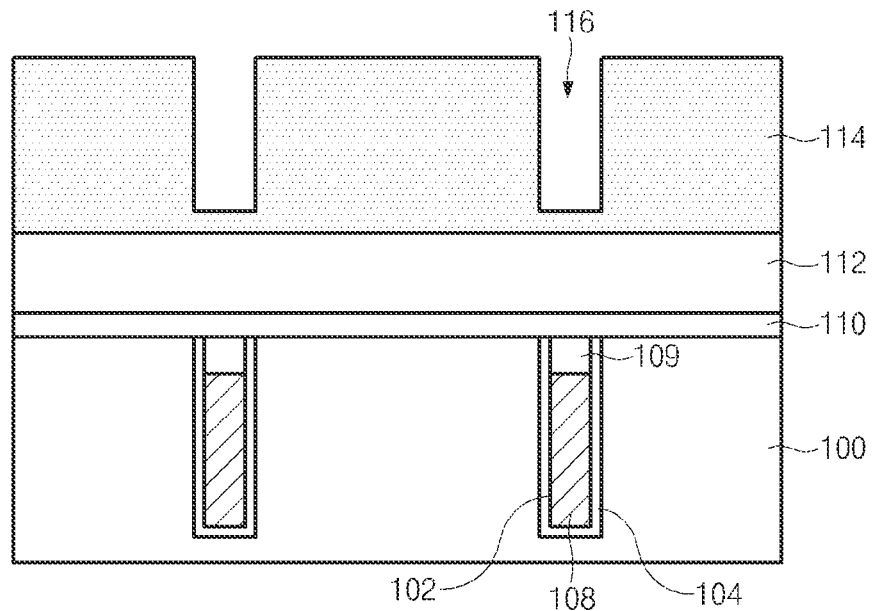

Referring to FIG. 2F, the silicon growth layer 114 is etched to a predetermined depth to form a trench 116. At this time, the trench 116 may be formed to be arranged substantially directly above the first gate electrode 108. The trench 116 may be formed so that a bottom of the trench 116 is spaced apart from a top of the bit line 112.

Figure 2G:
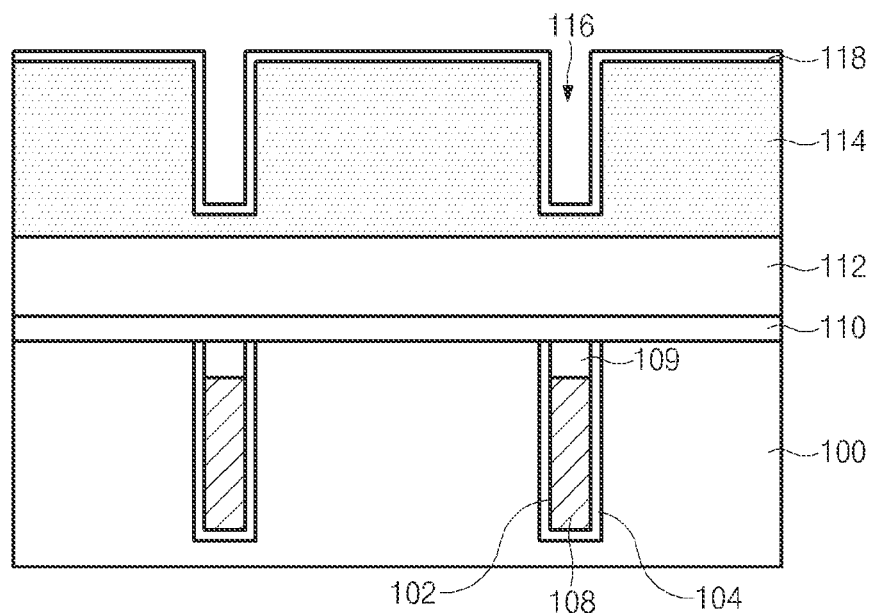

Referring to FIG. 2G, an insulating layer 118 is formed on a surface of the trench 116. Here, the insulating layer 118 may be an oxide layer formed by oxidizing the silicon growth layer 114.

Figure 2H:
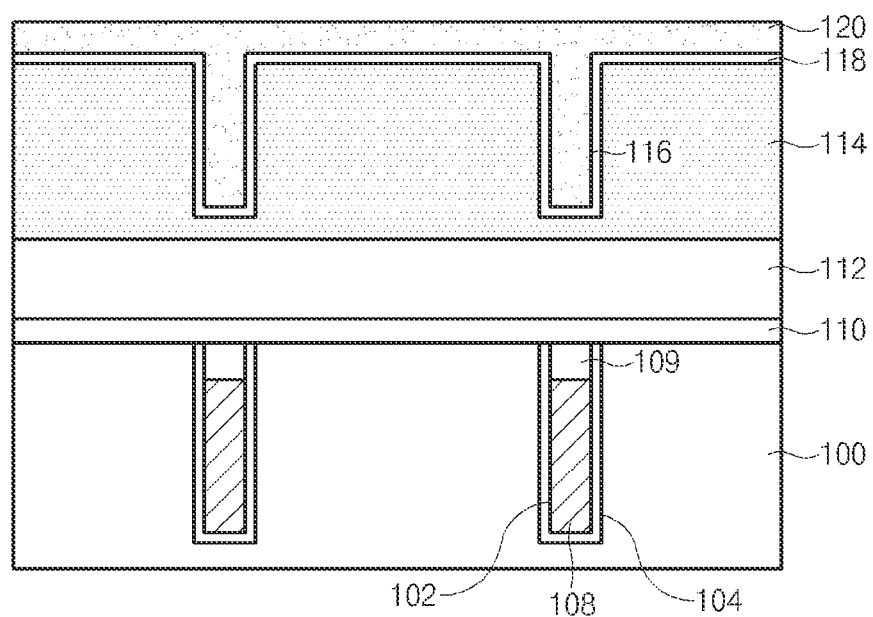

Referring to FIG. 2H, a second gate electrode layer 120 is formed on the insulating layer 118 to fill up the trench 116. Here, the second gate electrode layer 120 may include a tungsten layer.

Figure 2I:
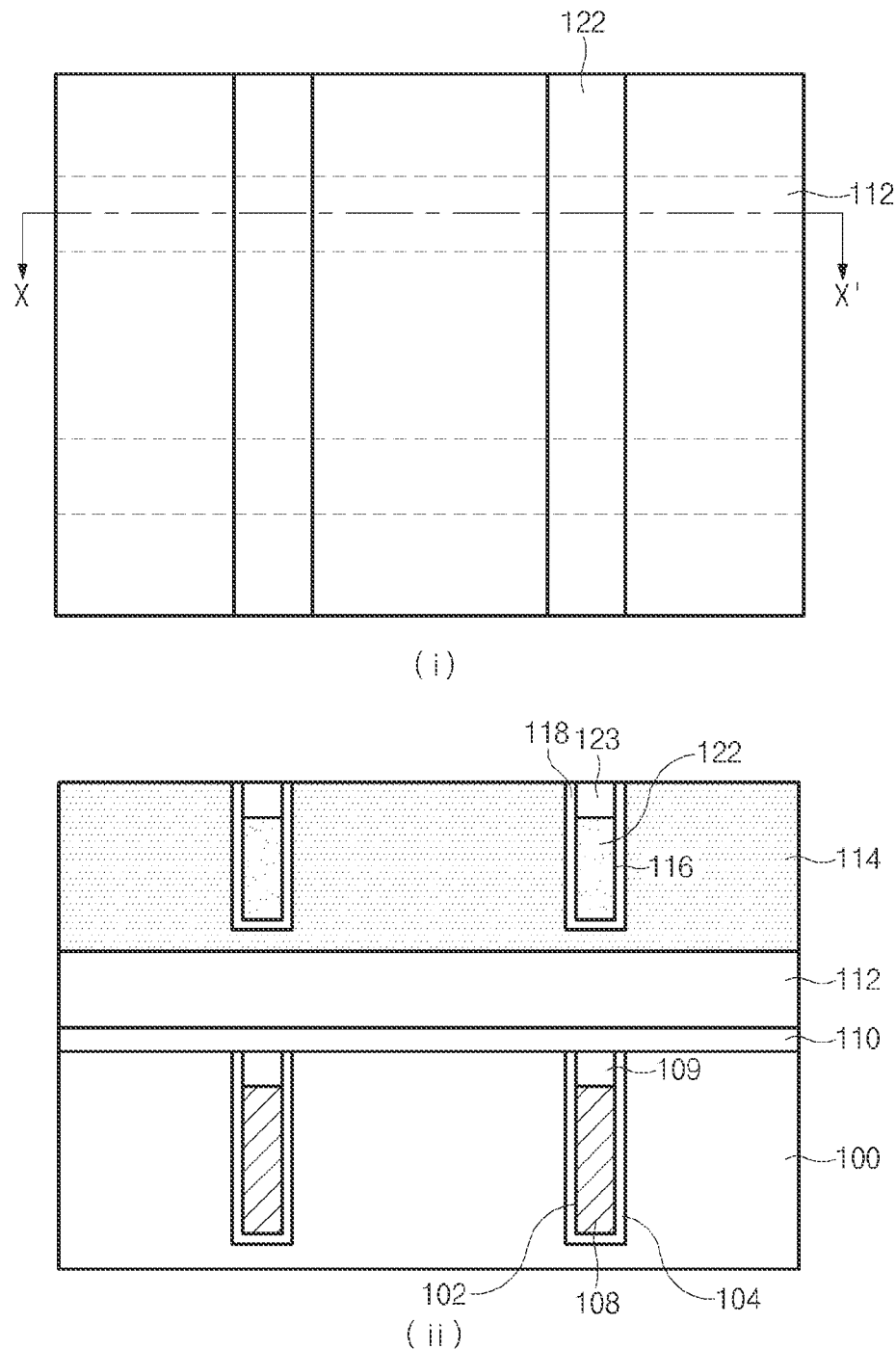
Figure 2J:
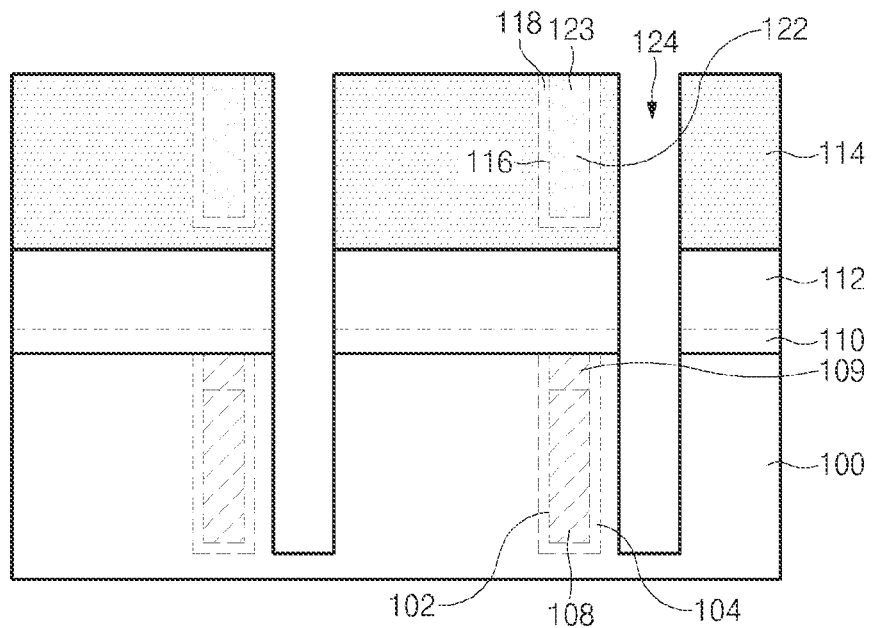

Referring to FIG. 2I, an etch-back process of the second gate electrode layer 120 is performed to form a first gate electrode 122 and an forming process of insulating layer 123 is performed over the first gate electrode 122 and etching process for planarization of the insulating layer 123 is performed to expose the silicon growth layer 114. Referring to FIG. 2I(i), the second gate electrode 122 is formed right above the first gate electrode 108 so that only the second gate electrode 122 is shown in a plan view.

Referring to FIG. 23, metal contact holes 124 are formed by etching the silicon growth layer 114 and the semiconductor substrate 100. At this time, the metal contact holes 124 may be formed so that a bottom of the metal contact holes 124 is located at substantially the same level as the bottom of the first gate electrode 108. Referring to FIG. 2N(i), the metal contact holes 124 are formed to be spaced apart diagonally across the second gate electrode 122 and across the bit line 112.

Figure 2K:
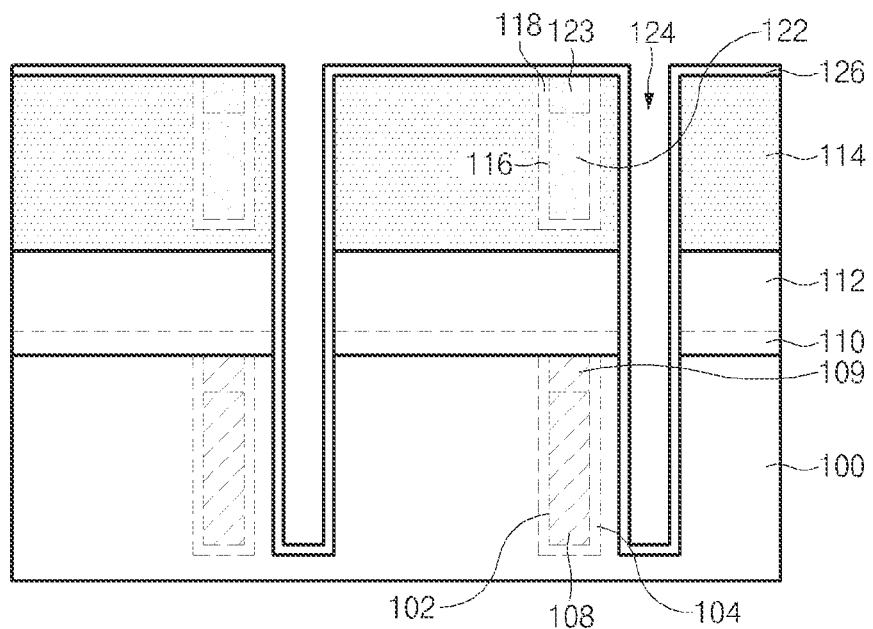

Referring to FIG. 2K, an insulating layer 126 is formed on a sidewall of the metal contact hole 124. Here, the insulating layer 126 is formed to prevent the first and second gate electrode 108 and 122 and the bit line 112 from being in electrical short. The insulating layer 126 may be an oxide layer.

Figure 2L:
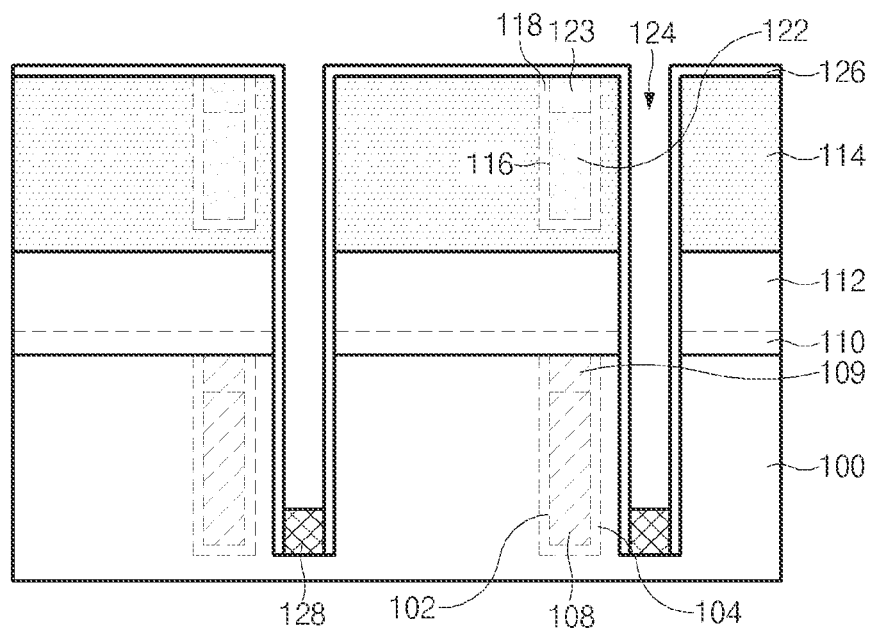

Referring to FIG. 2L, a portion of the insulating layer 126 formed at the bottom of the metal contact holes 124 is removed and then a polysilicon layer 128 is formed at a lower portion of the metal contact holes 124 to be in contact with the semiconductor substrate 100.

Figure 2M:
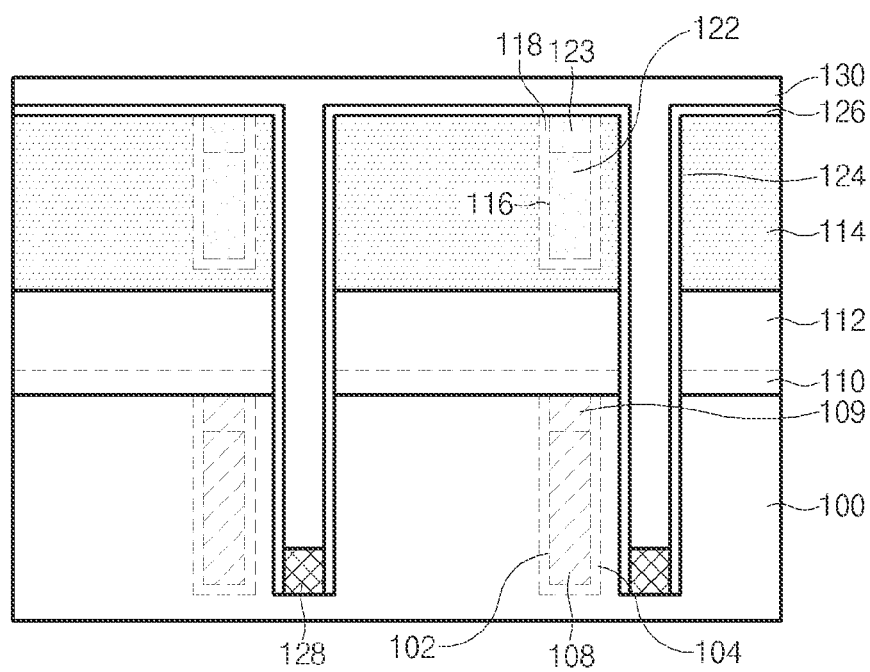
Figure 2N:
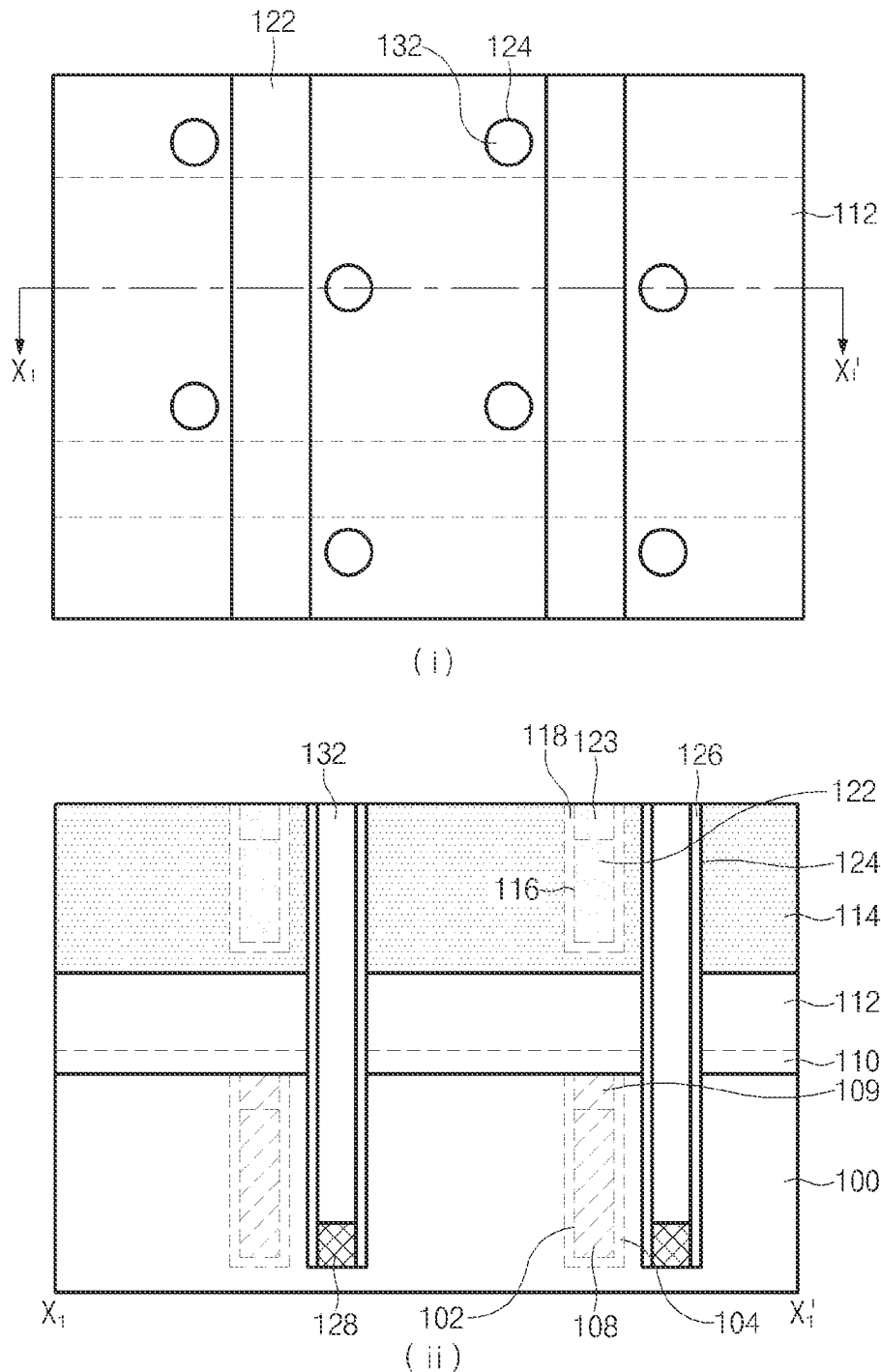

Referring to FIGS. 2M and 2N, a conductive layer 130 for a metal contact is formed on the polysilicon layer 128 and the insulating layer 126 (FIG. 2M), filling the metal contact hole 124. An etching process for planarization of the conductive layer 130 is performed until the silicon growth layer 114 is exposed, thereby forming metal contact plugs 132 (FIG. 2N). Here, the metal contact plugs 132 transfer data through the first gate electrode 108. Referring to FIG. 2N(i), the metal contact plugs 132 are formed to be spaced apart diagonally across the second gate electrode 122.

Figure 2O:
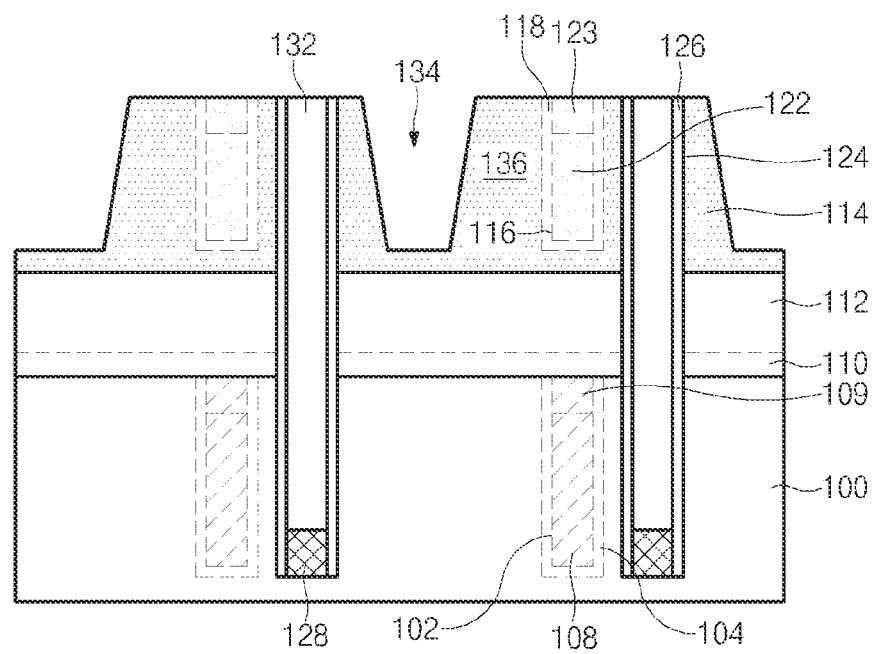

Referring to FIG. 2O, a portion of the silicon growth layer 114, in which the second gate electrode 122 and the metal contact plugs 132 are not formed, is etched to form a trench 134 for device isolation. The silicon growth layer 114 defined by the trench 134 for device isolation is an active region 136.

Figure 2P:
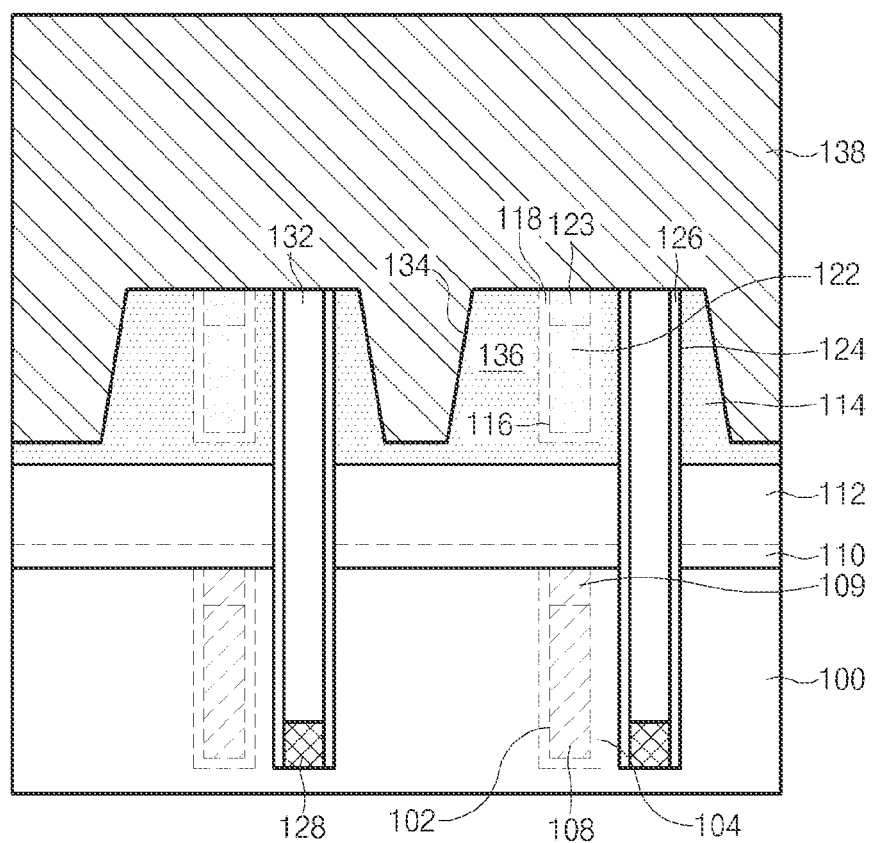

Referring to FIG. 2P, an interlayer insulating layer 138 is formed to fill in the trench 134 for device isolation. Here, the interlayer insulating layer 138 may include a spin on dielectric (SOD) layer.

Figure 2Q:
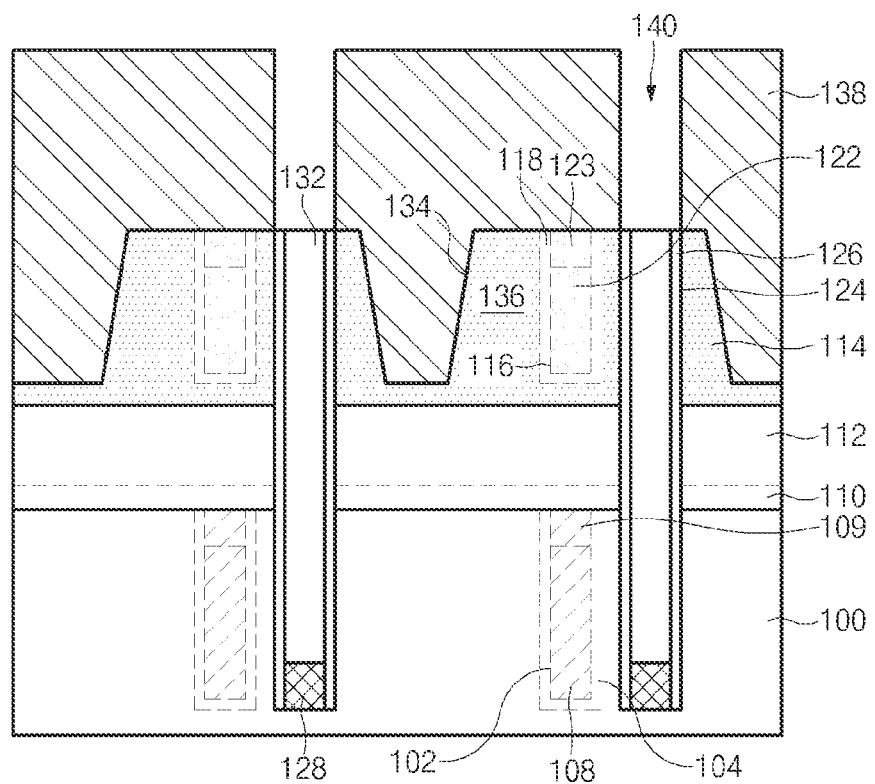
Figure 2R:
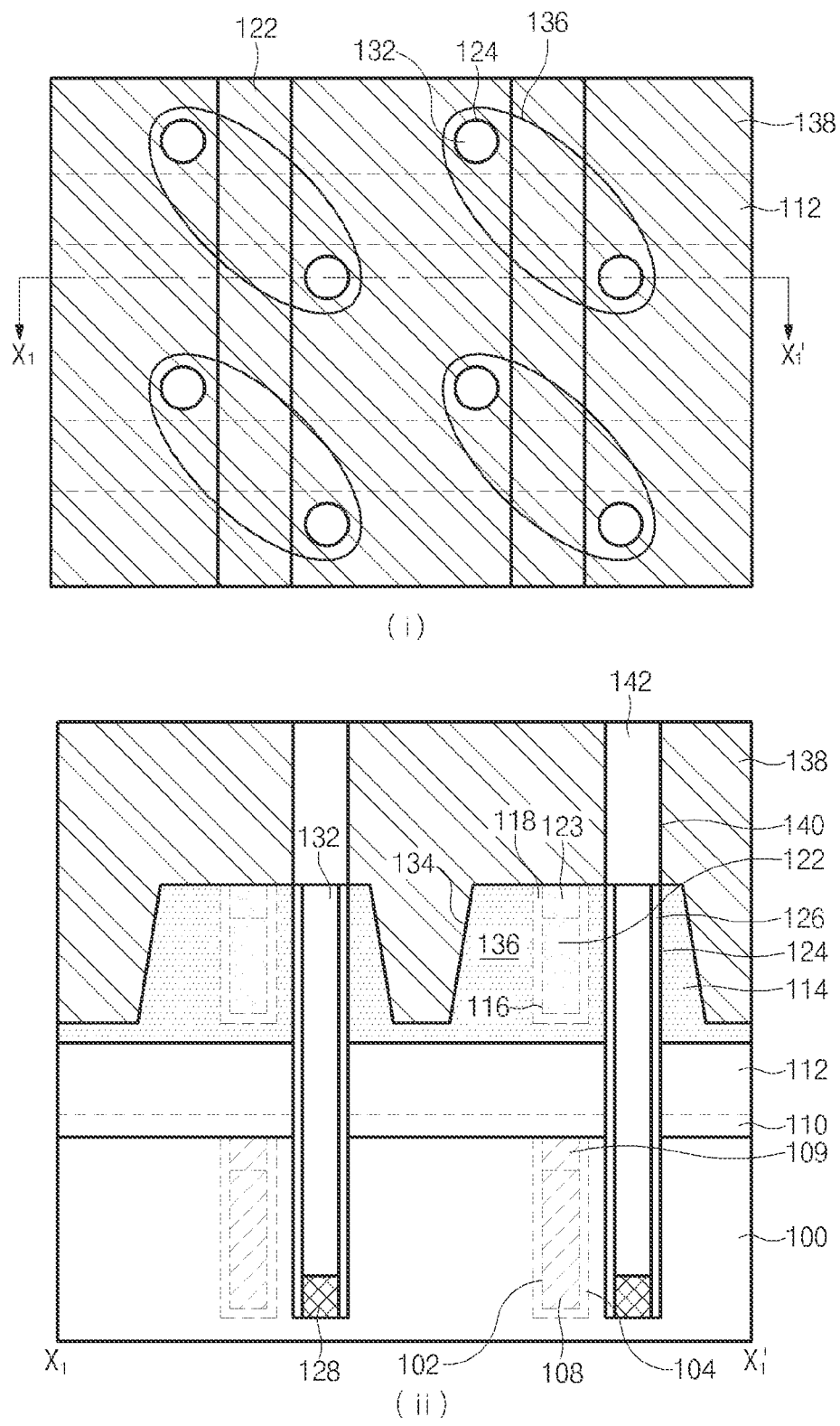

Referring to FIGS. 2Q and 2R, the interlayer insulating layer 138 is etched to expose the metal contact plugs 132, thereby forming storage node contact plug holes 140 (FIG. 2Q). A conductive layer for a storage node contact plug is formed on the interlayer insulating layer 138 while filling in the storage node contact plug holes 140 and then an etching process for planarization of the conductive layer for a storage node contact plug hole is performed to expose the interlayer insulating layer 138, thereby forming storage node contact plugs 142 (FIG. 2R).

As described above, according to an exemplary embodiment, the first gate electrode is formed in the semiconductor substrate and the second gate electrode is formed in the silicon growth layer formed over the semiconductor substrate so that the two gate electrodes are vertically arranged. Thereby, memory capacity is increased, even in the narrow active region, and it can be adapted to a semiconductor device with high integrity.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor device, comprising:
   a first gate electrode formed in a semiconductor substrate;
   a second gate electrode formed in a silicon growth layer provided over the semiconductor substrate, wherein the second gate electrode is formed to be arranged vertically above the first gate electrode;
   a bit line disposed between the semiconductor substrate and the silicon growth layer; and
   a first insulating layer formed over the first gate electrode and a second insulating layer formed over the second electrode.

2. The semiconductor device of claim 1, wherein the first gate electrode and second gate electrode extend perpendicular to the bit line.

3. The semiconductor device of claim 2, the device further comprising a storage node contact plug diagonally disposed while being spaced apart from the second gate electrode and the bit line.

4. The semiconductor device of claim 3, the device further comprising a metal contact plug coupled to a bottom of the storage node contact plug and formed in the silicon growth layer and the semiconductor substrate.

5. The semiconductor device of claim 4, the device further comprising a polysilicon layer coupled to a bottom of the metal contact plug.

6. The semiconductor device of claim 5, wherein the polysilicon layer is coupled to the semiconductor substrate.

7. The semiconductor device of claim 5, wherein a bottom of the polysilicon layer is formed at substantially the same level as a bottom of the first gate electrode.

8. The semiconductor device of claim 5, the device further comprising an insulating layer formed at a sidewall of the polysilicon layer and the metal contact plug.

9. The semiconductor device of claim 1, the device further comprising a third insulating layer disposed at a bottom and a sidewall of the first gate electrode, and a fourth insulating layer disposed at a bottom and sidewall of the second gate electrode.

10. The semiconductor device of claim 1, the device further comprising a third insulating layer disposed at a bottom and a sidewall of the first gate electrode, and a fourth insulating layer disposed at a bottom and sidewall of the second gate electrode.

11. A semiconductor device, comprising:
    a semiconductor substrate;
    an epitaxial layer;
    a bit line provided between the substrate and the epitaxial layer, the bit line being isolated from the substrate and coupled to the epitaxial layer;
    a storage node contact plug having a first portion and a second portion, the first portion extending into the epitaxial layer and the second portion extending into the semiconductor substrate;
    a first gate electrode formed in the substrate;
    a second gate electrode formed in the epitaxial layer; and
    a first insulating layer formed over the first gate electrode and a second insulating layer formed over the second electrode.

* * * * *